(12) United States Patent
Hoshino et al.

(10) Patent No.: US 10,418,310 B2
(45) Date of Patent: Sep. 17, 2019

(54) BGA PACKAGE SUBSTRATE AND METHOD OF MANUFACTURING THE SAME

(71) Applicant: FUJITSU LIMITED, Kawasaki-shi, Kanagawa (JP)

(72) Inventors: Yuki Hoshino, Yokohama (JP); Kenji Fukuzono, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/006,895

(22) Filed: Jun. 13, 2018

(65) Prior Publication Data

US 2018/0366398 A1  Dec. 20, 2018

(30) Foreign Application Priority Data

Jun. 20, 2017  (JP) ................. 2017-120784

(51) Int. Cl.
| | |
|---|---|
| *H05K 1/11* | (2006.01) |
| *H01L 23/498* | (2006.01) |
| *H01L 21/48* | (2006.01) |
| *B23K 1/00* | (2006.01) |
| *B23K 1/20* | (2006.01) |
| *B23K 3/06* | (2006.01) |
| *B23K 3/08* | (2006.01) |
| *B23K 101/40* | (2006.01) |

(52) U.S. Cl.
CPC ...... *H01L 23/49816* (2013.01); *B23K 1/0016* (2013.01); *B23K 1/203* (2013.01); *B23K 3/0623* (2013.01); *B23K 3/08* (2013.01); *H01L 21/4853* (2013.01); *H01L 23/49838* (2013.01); *H05K 1/115* (2013.01); *B23K 2101/40* (2018.08); *H01L 2924/15151* (2013.01)

(58) Field of Classification Search
CPC . H01L 2924/15151; H01L 2924/15331; H01L 2924/15321; H05K 1/115; H05K 1/116
See application file for complete search history.

(56) References Cited

U.S. PATENT DOCUMENTS

| 6,028,366 A | 2/2000 | Abe | |
|---|---|---|---|
| 2005/0023679 A1* | 2/2005 | Liu | ............. H01L 23/49811 257/737 |
| 2017/0018489 A1* | 1/2017 | Gandhi | ............. H01L 23/49811 |

FOREIGN PATENT DOCUMENTS

| JP | 10-256418 | 9/1998 |
|---|---|---|
| JP | 11-87427 | 3/1999 |

* cited by examiner

*Primary Examiner* — Jeremy C Norris
(74) *Attorney, Agent, or Firm* — Fujitsu Patent Center

(57) ABSTRACT

A BGA package substrate includes a substrate, a resist formed over the substrate and includes an opening, a land formed over the substrate in the opening, and a solder ball fused to the land, wherein the resist includes a notch at an edge of the opening through which the land is exposed, the notch having a bottom at a position lower than a surface of the land.

7 Claims, 20 Drawing Sheets

FIG.20A1
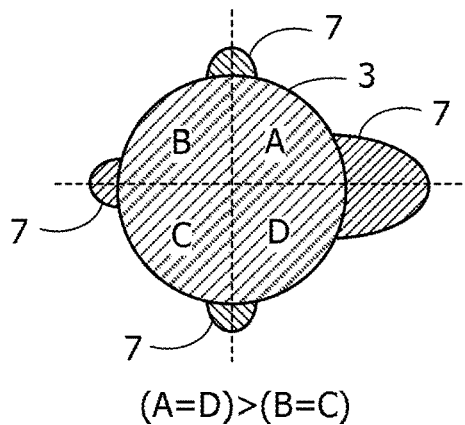
(A=D)>(B=C)
FIG.20A2
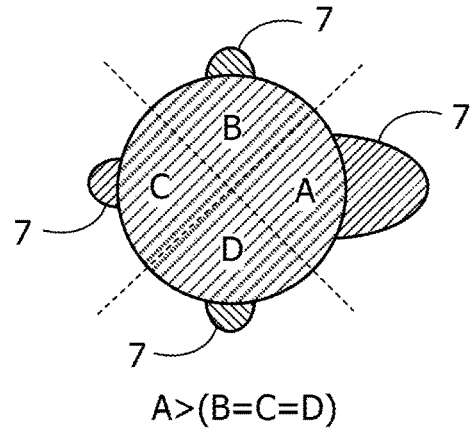
A>(B=C=D)
FIG.20B1
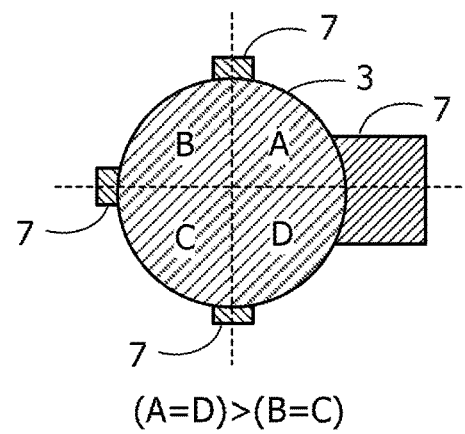
(A=D)>(B=C)
FIG.20B2
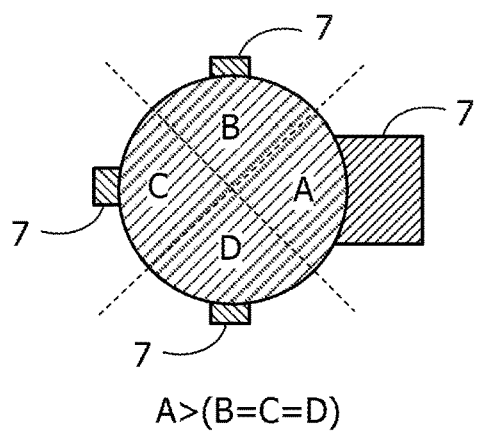
A>(B=C=D)
FIG.20C1
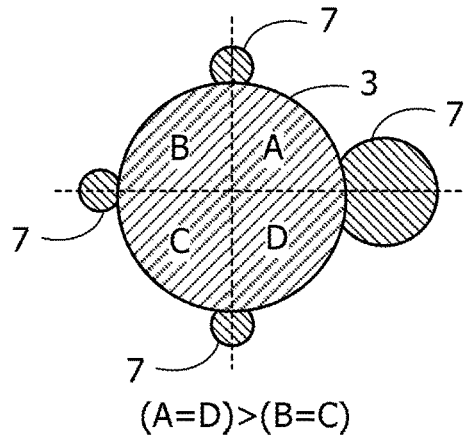
(A=D)>(B=C)
FIG.20C2
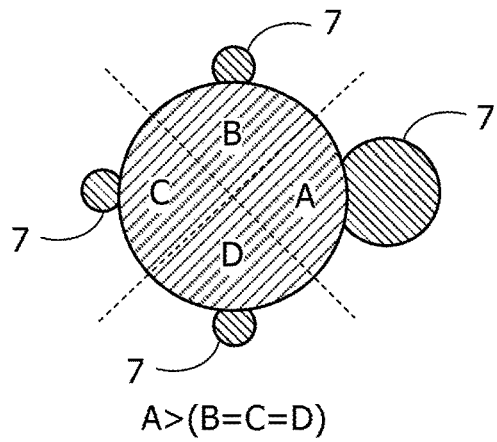
A>(B=C=D)

_US 10,418,310 B2_

BGA PACKAGE SUBSTRATE AND METHOD OF MANUFACTURING THE SAME

CROSS-REFERENCE TO RELATED APPLICATION

This application is based upon and claims the benefit of priority of the prior Japanese Patent Application No. 2017-120784, filed on Jun. 20, 2017, the entire contents of which are incorporated herein by reference.

FIELD

The embodiment discussed herein is related to a BGA package substrate and a method of manufacturing the BGA package substrate.

BACKGROUND

Electronic devices have been steadily miniaturized. In order to cope with miniaturization of electronic devices, BGA system package substrates (hereinafter referred to as a "BGA package substrate") having an electrode geometry in which solder balls for electrically connecting a semiconductor chip to a substrate are arranged vertically and horizontally have been used in recent years.

Along with an increase in the amount of information inputted and outputted to and from a semiconductor chip, the number of solder balls provided in a BGA package substrate is continuously increasing. In addition, along with an increase in the amount of information processed by a semiconductor chip, the power consumption of the semiconductor chip is increasing. Thus, the solder balls provided in a BGA package substrate are demanded to have a size which does not cause the current density to exceed an allowable current density. That is, a large number of solder balls are provided in a BGA package substrate, each of the solder balls having a size which does not cause the current density to exceed an allowable current density. Thus, the pitch between solder balls provided vertically and horizontally in a BGA package substrate is inevitably reducing.

Meanwhile, when solder balls provided in a BGA package substrate are brought into contact with each other, a short circuit occurs. Thus, the solder balls provided in a BGA package substrate are demanded to be fused to the BGA package substrate in a state where the solder balls are spaced apart. However, when a solder ball is fused to a BGA package substrate, flux applied to the solder ball spreads over a land, and thus the solder ball may be moved through following the flow of the flux spreading over the land. When adjacent solder balls are moved in respective directions which allow the solder balls to approach each other, a short circuit may occur due to contact between the solder balls. When the pitch between lands is reduced, a short circuit due to contact between solder balls is likely to occur.

The followings are reference documents.
[Document 1] Japanese Laid-open Patent Publication No. 11-87427 and
[Document 2] Japanese Laid-open Patent Publication Nos. 10-256418.

SUMMARY

According to an aspect of the invention, an apparatus includes A BGA package substrate includes a substrate, a resist formed over the substrate and includes an opening, a land formed over the substrate in the opening, and a solder ball fused to the land, wherein the resist includes a notch at an edge of the opening through which the land is exposed, the notch having a bottom at a position lower than a surface of the land.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 20A1 to 20C2 are second views illustrating variations in the forms of notches.

DESCRIPTION OF EMBODIMENT

Hereinafter, an embodiment will be described. The embodiment described below is merely an example, and does not limit the technical scope of the present disclosure to the aspect in the following.

Figure 1:
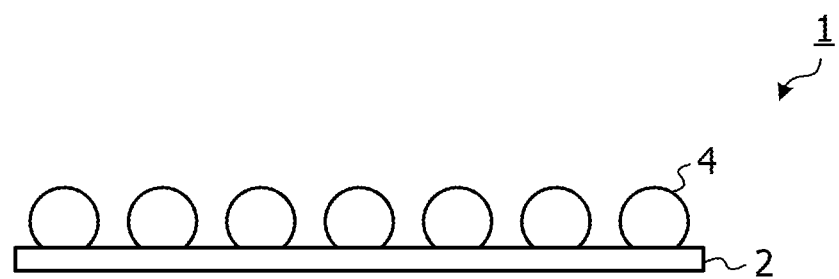
FIG. 1 is a side view illustrating a BGA package substrate according to an embodiment.
Figure 2:
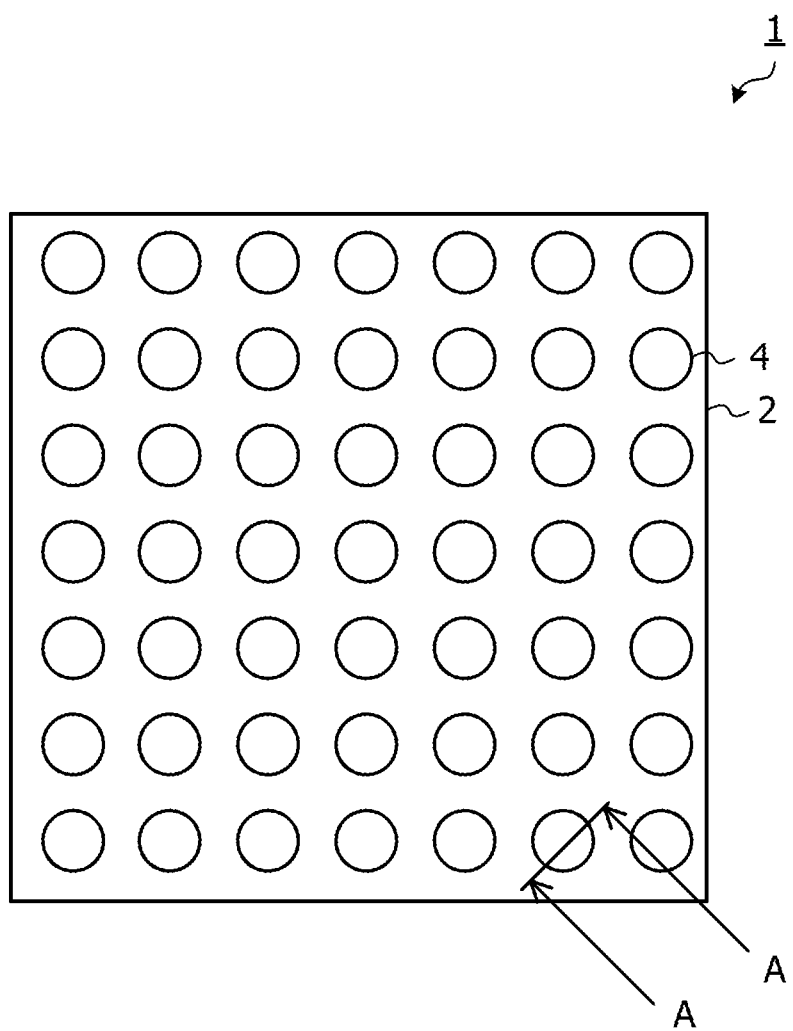
FIG. 2 is a view of the BGA package substrate according to the embodiment, as seen from the side of the substrate, on which solder balls are arranged.

FIG. 1 is a side view illustrating a BGA package substrate according to an embodiment. FIG. 2 is a view of a BGA package substrate 1 according to the embodiment, as seen from the side of the substrate, on which solder balls 4 are arranged. The BGA package substrate 1 includes a plate-shaped substrate 2 in which a semiconductor chip is mounted, and solder balls 4 arranged vertically and horizontally on the surface of the substrate 2. The substrate 2 is sometimes called an interposer because the substrate 2 has a function of electrically connecting a mainboard in which the BGA package substrate 1 is mounted to the semiconductor chip mounted in the substrate 2.

Figure 3:
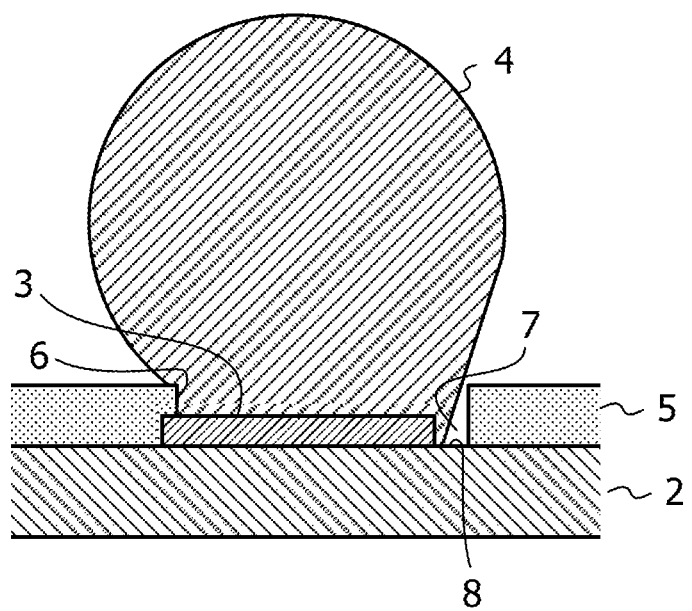
FIG. 3 is a cross-sectional view of the portion indicated by symbol A-A in FIG. 2.

FIG. 3 is a cross-sectional view of the portion indicated by symbol A-A in FIG. 2. Lands 3 and a resist 5 are formed on the substrate 2. Each of the solder balls 4 is fused to a corresponding one of lands 3. The resist 5 is formed on the surface of the substrate 2, and covers the space between adjacent lands 3. Thus, when the solder balls 4 are not fused, each of the lands 3 is exposed through a corresponding one of openings 6 of the resist 5.

The resist 5 has notches 7. Each of the notches 7 is provided at an edge of a corresponding one of the openings 6 through which one of the lands 3 is exposed. The notch 7 has a bottom 8 at a position lower than the surface of the land 3. Since the bottom 8 of the notch 7 is located at a position lower than the surface of the land 3, flux used for fusing each of the solder balls 4 to the land 3 flows down from the surface of the land 3. The notch 7 of each opening 6 and the notch 7 of any adjacent opening 6 are disposed in the same positional relationship. In other words, the notches 7 are each formed in the opening 6 at a position deviated in the same direction.

Since the BGA package substrate 1 has the above-described notch 7 in each opening 6 of the resist 5, when the solder ball 4 is fused to the land 3, the solder ball 4 is moved to the notch 7 through following the flow of flux which flows down from the surface of the land 3 to the bottom 8 of the notch 7. Since the notches 7 are each formed in the opening 6 at a position deviated in the same direction, each solder ball 4 fused to one of the lands 3 arranged in proximity to each other is disposed deviated in the same direction with respect to the land 3. Thus, the pitch between the solder balls 4 fused to the lands 3 arranged in proximity to each other is maintained at substantially the same distance.

In the BGA package substrate 1 of the embodiment, even when the pitch between the solder balls 4 is reduced by increasing the number of solder balls 4 to cope with an increase in the amount of information inputted and outputted to and from a semiconductor chip mounted in the BGA package substrate 1, the pitch between the solder balls 4 provides substantially the same distance. Therefore, in the BGA package substrate 1 of the embodiment, a short circuit due to contact between solder balls 4 is unlikely to occur.

Hereinafter, an example of a method of manufacturing the BGA package substrate 1 will be described.

Figure 4:
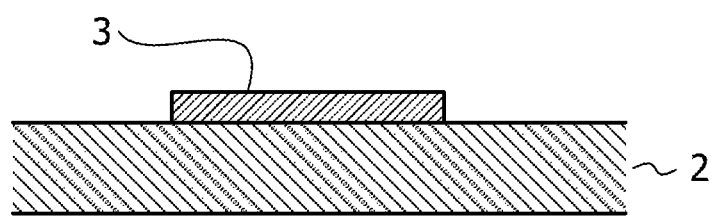
FIG. 4 is a first view illustrating a step of manufacturing the BGA package substrate.

FIG. 4 is a first view illustrating a step of manufacturing the BGA package substrate 1. When the BGA package substrate 1 is manufactured, a substrate 2, on which lands 3 are arranged, is prepared.

Figure 5:
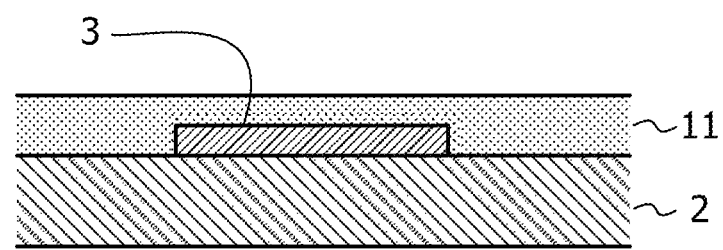
FIG. 5 is a second view illustrating a step of manufacturing the BGA package substrate.

FIG. 5 is a second view illustrating a step of manufacturing the BGA package substrate 1. After the substrate 2, on which the lands 3 are arranged, is prepared, a solder resist 11 is formed on the surface of the substrate 2. To form the solder resist 11, a solution may be applied to the substrate 2 and dried, or a sheet-like resist may be bonded to the substrate 2. When the solder resist 11 is formed by applying a solution to the substrate 2, the solution is preferably applied with a uniform thickness. Methods of applying the solder resist 11 include, for instance, spray coating, curtain coating, and other various methods.

Figure 6:
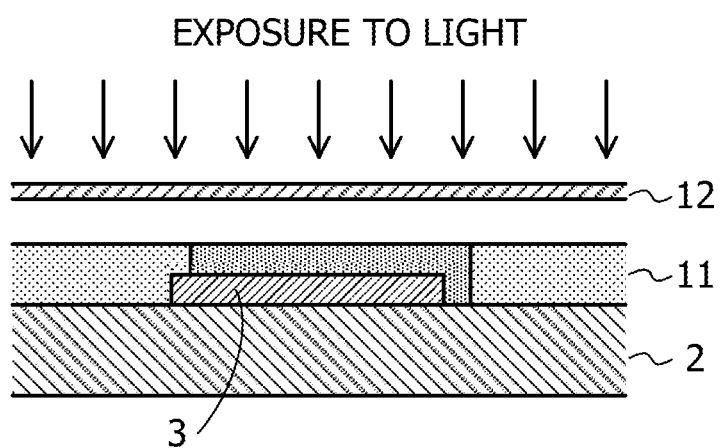
FIG. 6 is a third view illustrating a step of manufacturing the BGA package substrate.

FIG. 6 is a third view illustrating a step of manufacturing the BGA package substrate 1. After the solder resist 11 is formed, light exposure using the mask 12 is made. In the mask 12 used for light exposure, a pattern representing the shapes of the openings 6 and the notches 7 is formed. Depending on the physical properties of the solder resist 11, for instance, a negative pattern, in which light does not pass through the portions corresponding to the openings 6 and the notches 7, is used as the mask 12 used for light exposure, or a positive pattern, in which light passes through the portions corresponding to the openings 6 and the notches 7, is used as the mask 12.

Figure 7:
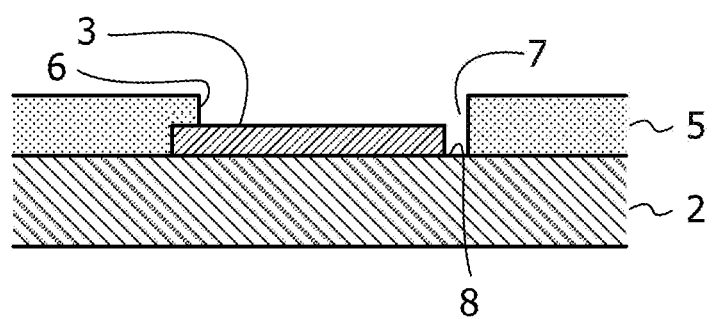
FIG. 7 is a fourth view illustrating a step of manufacturing the BGA package substrate.

FIG. 7 is a fourth view illustrating a step of manufacturing the BGA package substrate 1. After light exposure to the solder resist 11 is made, a processing procedure of immersing the substrate 2 with the solder resist 11 formed in a predetermined solution is performed. When the solder resist 11, which has been exposed to light using a pattern representing the shapes of the openings 6 and the notches 7 is formed, is brought into contact with the predetermined solution, the portions of the solder resist 11, corresponding to the openings 6 and the notches 7 are removed, and the lands 3 are exposed. Thus, a resist 5 having the openings 6 and the notches 7 as described above is formed.

Figure 8:
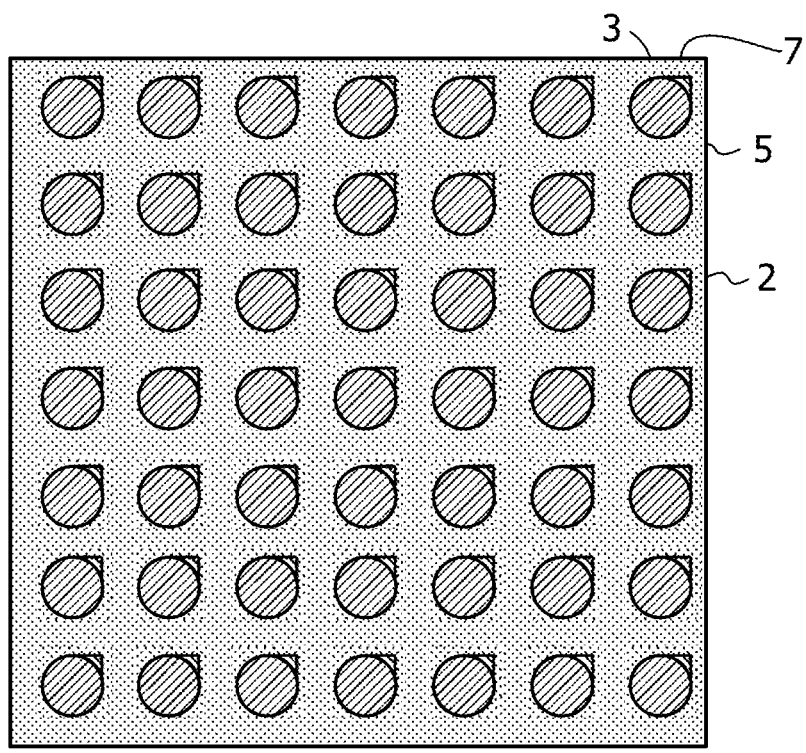
FIG. 8 is an overall plan view of the substrate partially illustrated in FIG. 7, as seen from the side on which lands are exposed.

FIG. 8 is an overall plan view of the substrate 2 partially illustrated in FIG. 7, as seen from the side on which the lands 3 are exposed. Since FIG. 8 illustrates the external appearance of the substrate 2, a cross section is basically not visible. However, in order to facilitate the understanding of a correspondence relationship between members, the same hatching is applied to those members which are the same as the portions indicated by hatching in FIG. 7. As seen from FIG. 8, each notch 7 and the notch 7 of any adjacent opening 6 are disposed in the same positional relationship. In other words, all the notches 7 of the openings 6 are provided at respective edges of the openings 6 uniformly in the same direction.

Figure 9:
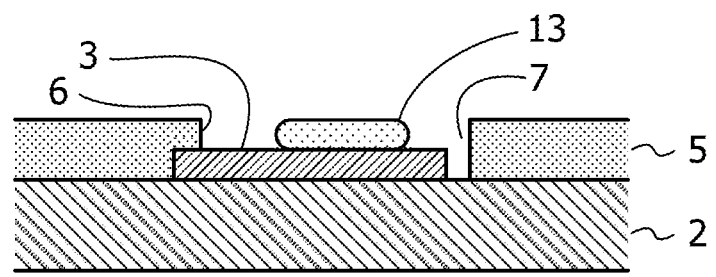
FIG. 9 is a fifth view illustrating a step of manufacturing the BGA package substrate.

FIG. 9 is a fifth view illustrating a step of manufacturing the BGA package substrate 1. After the openings 6 and the notches 7 are formed in the solder resist 11, a flux 13 is transferred to each of the lands 3.

Figure 10:
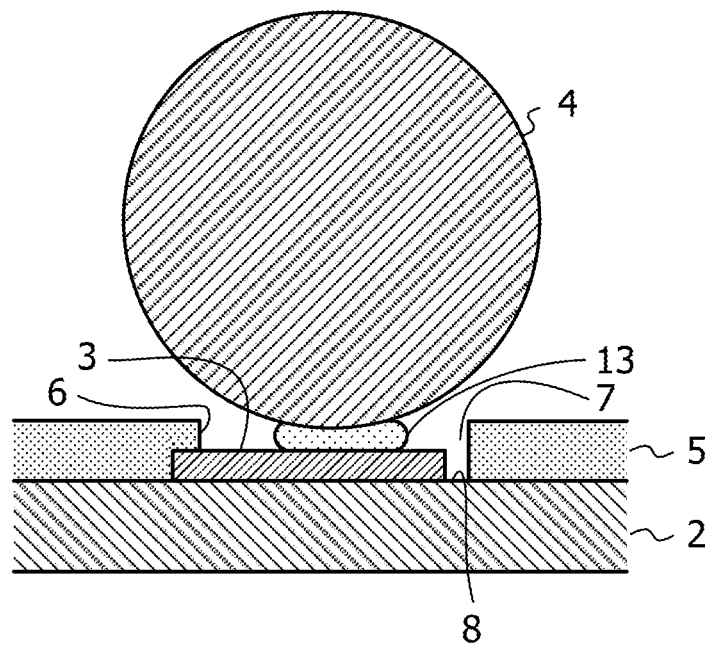
FIG. 10 is a sixth view illustrating a step of manufacturing the BGA package substrate.

FIG. 10 is a sixth view illustrating a step of manufacturing the BGA package substrate 1. After the flux 13 is transferred to the land 3, a solder ball 4 is placed on the land 3 with the flux 13 interposed between the solder ball 4 and the land 3. The flux 13 and the solder ball 4 are heated in a state where the solder ball 4 is placed on the land 3 with the flux 13 interposed between the solder ball 4 and the land 3. When the heated flux 13 and solder ball 4 are melted, a BGA package substrate 1 with the solder balls 4 fused to the respective lands 3 is produced as illustrated in FIG. 3.

Figure 11:
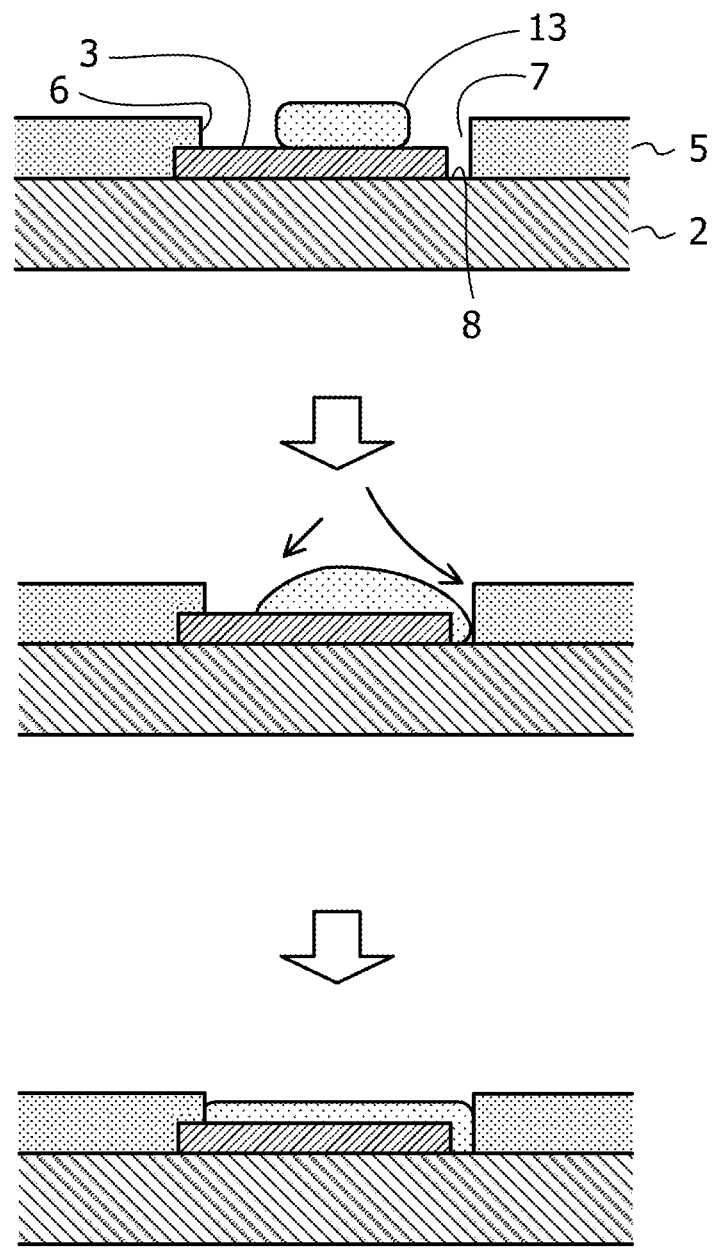
FIG. 11 is a sequence of views illustrating the manner in which flux is melted.

FIG. 11 is a sequence of views illustrating the manner in which the flux 13 is melted. When the heated flux 13 reaches a melting point and is melted, the flux 13 transferred in a solid state to the surface of the land 3 is melted and flows down to the bottom 8 of the notch 7. Thus, the solder ball 4 placed on the land 3 with the flux 13 interposed between the solder ball 4 and the land 3 is moved along with the flow of the flux 13. Consequently, the solder ball 4 is deviated to the notch 7 in the land 3.

Figure 12:
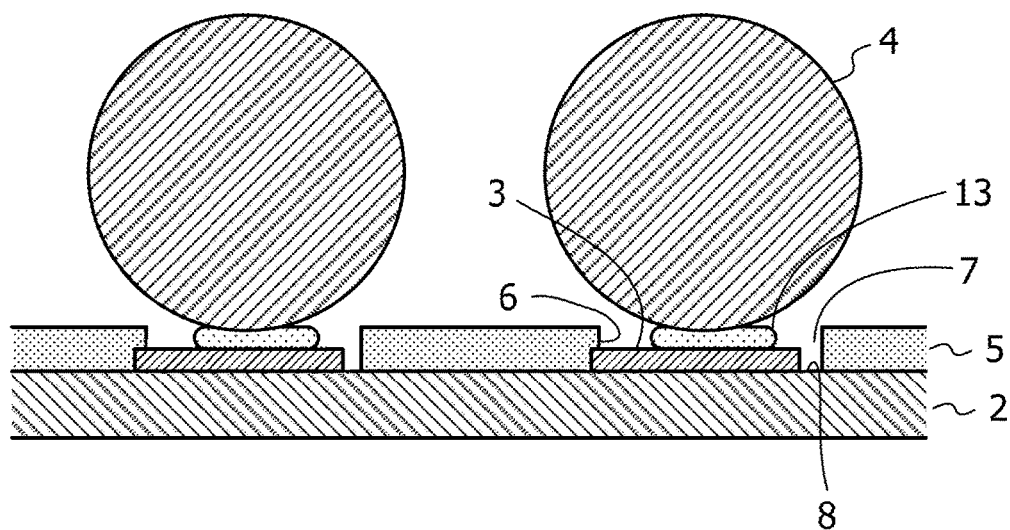
FIG. 12 is a sequence of side views illustrating the movement of solder balls before and after flux is melted.
Figure 12:
Figure 12:
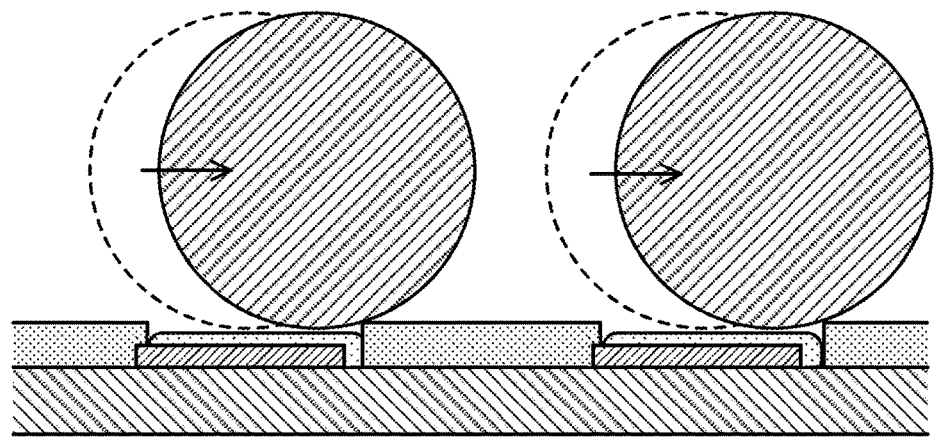
Figure 13:
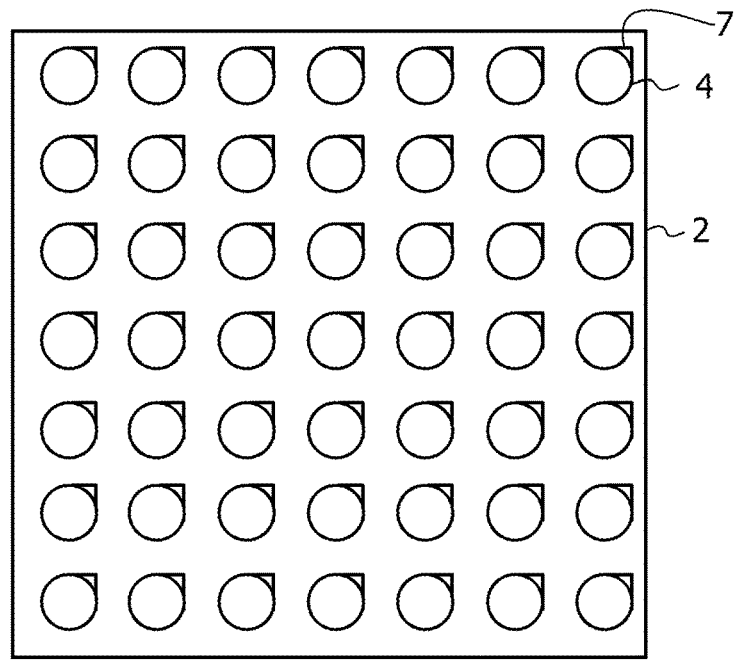
FIG. 13 is a sequence of overall plan views illustrating the movement of solder balls before and after flux is melted, as seen from the side on which solder balls are arranged.
Figure 13:
Figure 13:
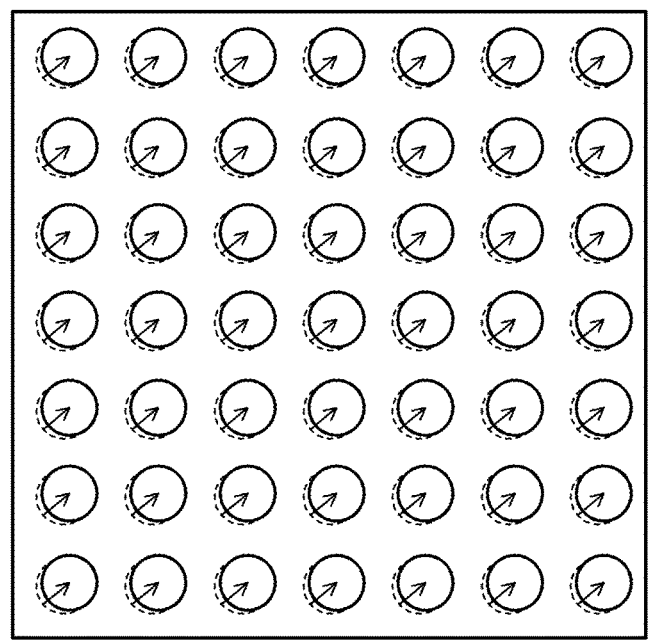

FIG. 12 is a sequence of side views illustrating the movement of solder balls 14 before and after the flux 13 is melted. In addition, FIG. 13 is a sequence of overall plan views illustrating the movement of the solder balls 4 before and after the flux 13 is melted, as seen from the side on which the solder balls 4 are arranged. Each of the solder balls 4 placed on a land 3 with the flux 13 interposed between the solder ball 4 and the land 3 is melted and moved to the notch 7 along the flow of the flux 13 which flows down from the land 3 to the bottom 8 of the notch 7. Since each notch 7 and the notch 7 of any adjacent opening 6 are disposed in the same positional relationship, the solder ball 4 and adjacent solder balls 4 are moved in the same direction as illustrated in FIG. 13. Thus, any two solder balls 4 are not set in proximity and brought into contact with each other, and the solder balls 4 are fused to the respective lands 3 with a substantially the same pitch maintained. Consequently, occurrence of a short circuit between solder balls 4 is reduced as much as possible.

Figure 14A:
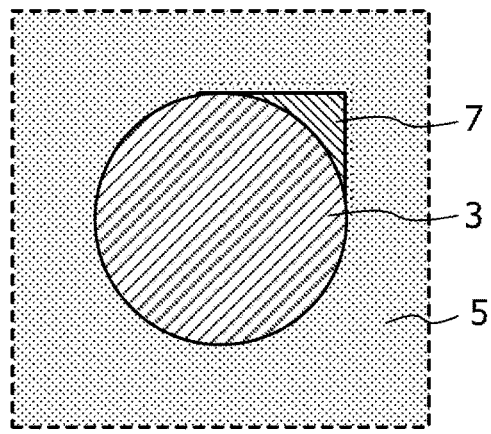
FIGS. 14A to 14F are first views illustrating variations in the forms of notches.
Figure 14B:
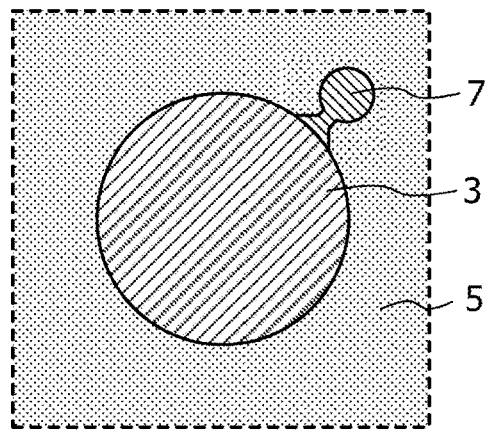
Figure 14C:
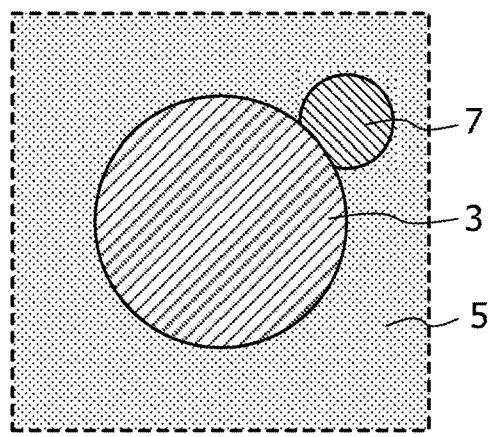
Figure 14D:
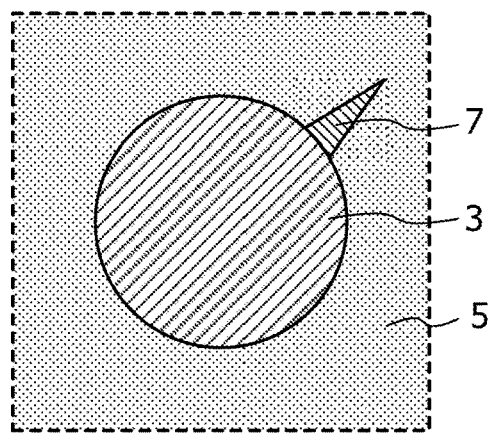
Figure 14E:
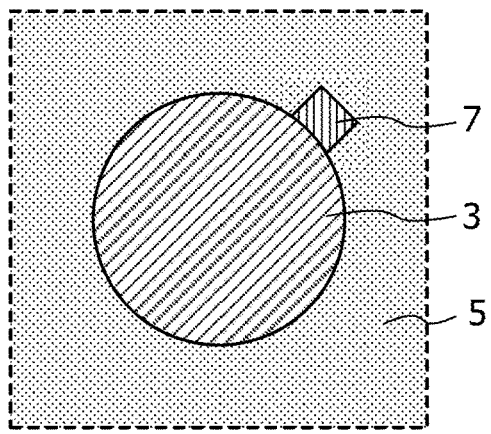
Figure 14F:
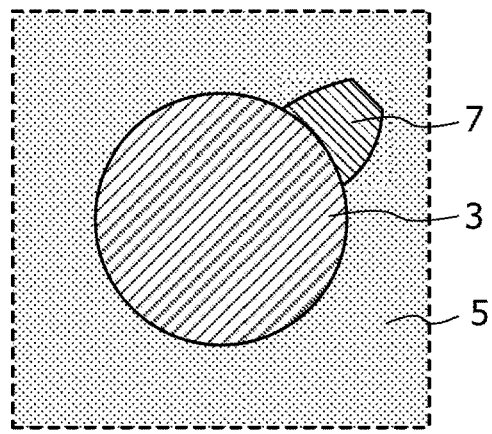

FIGS. 14A to 14F are first views illustrating the variations in the forms of the notch 7. Various variations as the forms of the notch 7 are applicable. The notch 7 may be, for instance, a substantially triangle form as illustrated in FIG. 14A, a gourd-shaped form as illustrated in FIG. 14B, a bun-shaped form as illustrated in FIG. 14C, a sharp needle-shaped form as illustrated in FIG. 14D, a square-shaped form as illustrated in FIG. 14E, or a hat-shaped form as illustrated in FIG. 14F. Alternatively, the form of the notch 7 is not limited to the forms exemplified in FIGS. 14A to 14F, and may be other various forms which allow the flux 13 to flow in from the land 3.

Figure 15:
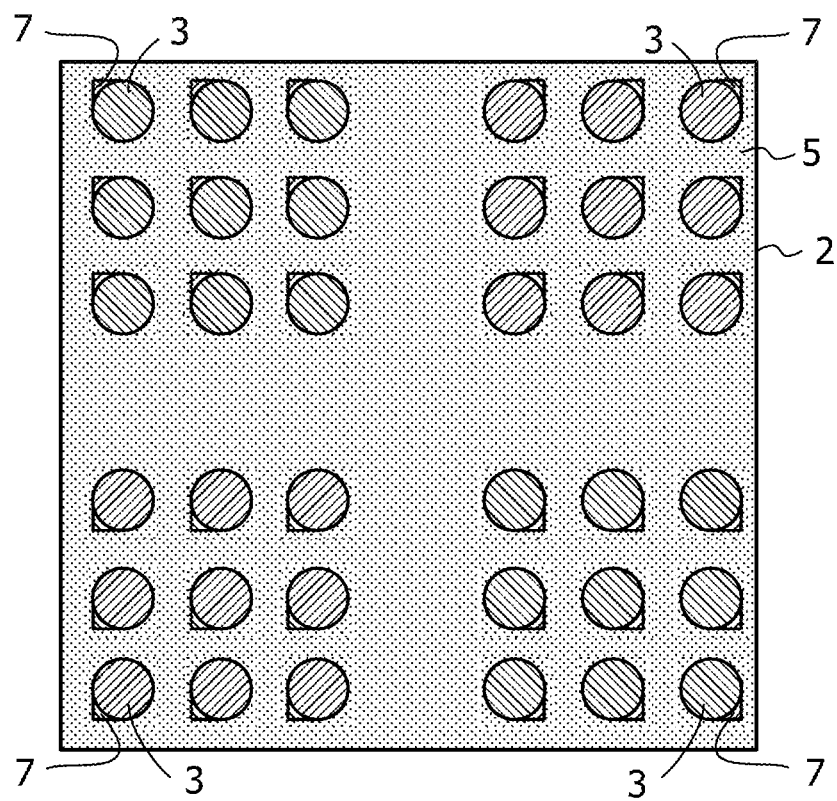
FIG. 15 is a view illustrating variations in the arrangement of notches.

FIG. 15 is a view illustrating variations in the arrangement of the notches 7. The notches 7 are not limited to the configuration in which the notches 7 are formed at a position deviated uniformly in the same direction in all the openings 6 as illustrated in FIG. 8. For instance, when a group of openings 6, which are disposed in proximity to each other, is formed at a position spaced apart from other openings 6, the notches 7 may be formed at a position deviated in the same direction in the group of openings 6, and may not be formed at a position deviated in the same direction in the other openings 6. In this case, the group of openings 6 and the other openings 6 are preferably separated from each other by at least the diameter of each solder ball 4.

Also, the notches 7 are not limited to the configuration in which one notch 7 is formed in each opening 6. For instance, two or more notches 7 may be provided in each opening 6. In this case, regarding the areas of the bottoms 8 of multiple notches 7 present in one opening 6, for instance, in one of regions divided every 90 degrees around the center of the land 3, the combined area of the land 3 and the bottom 8 of the notch 7 is preferably greater than the area of other three regions. Even when multiple notches 7 are present in one opening 6, if the regions divided every 90 degrees around the center of the land 3 satisfy the above-mentioned condition, the solder balls 4 may be moved in a certain direction.

Figure 16:
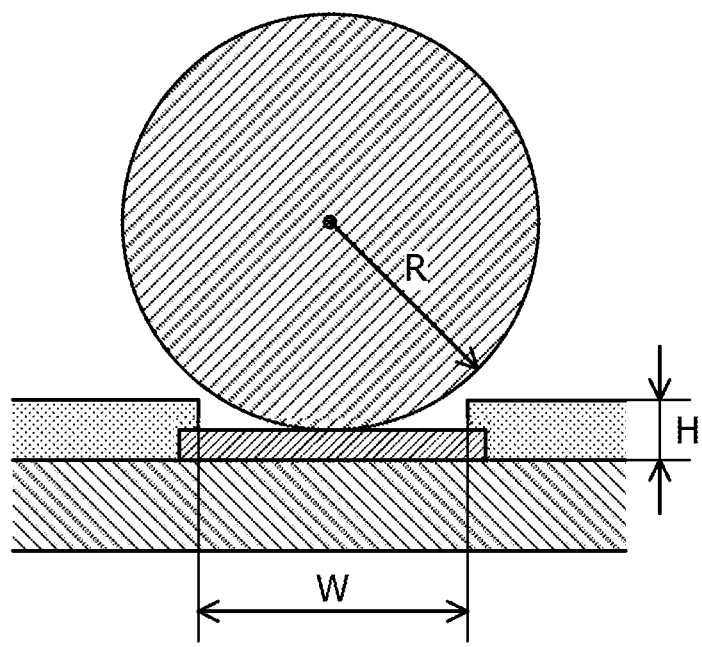
FIG. 16 is a view illustrating the relationship between the sizes of an opening and a solder ball.

FIG. 16 is a view illustrating the relationship between the sizes of the opening 6 and the solder ball 4. The notches 7 make full use of the function of controlling the flow direction of the flux 13 when the solder balls 4 placed on the lands 3 are not stably supported by the respective edges of the opening 6. For instance, the condition stated below may be considered for the relationship between the sizes of the opening 6 and the solder ball 4 when the solder balls 4 placed on the lands 3 are not stably supported by the respective edges of the opening 6. Specifically, for instance, under the assumption that the solder ball 4 is a perfect sphere with a radius R, the opening 6 is a perfect circular opening with a diameter W, and the height from the upper surface of the land 3 to the upper edge of the opening 6 is H, when R, W, and H have a dimensional relationship satisfying Expression (1) below, the solder balls 4 placed on the lands 3 are not stably supported by the respective edges of the opening 6.

$$W > 2\sqrt{2RH + H^2} \tag{1}$$

Figure 17:
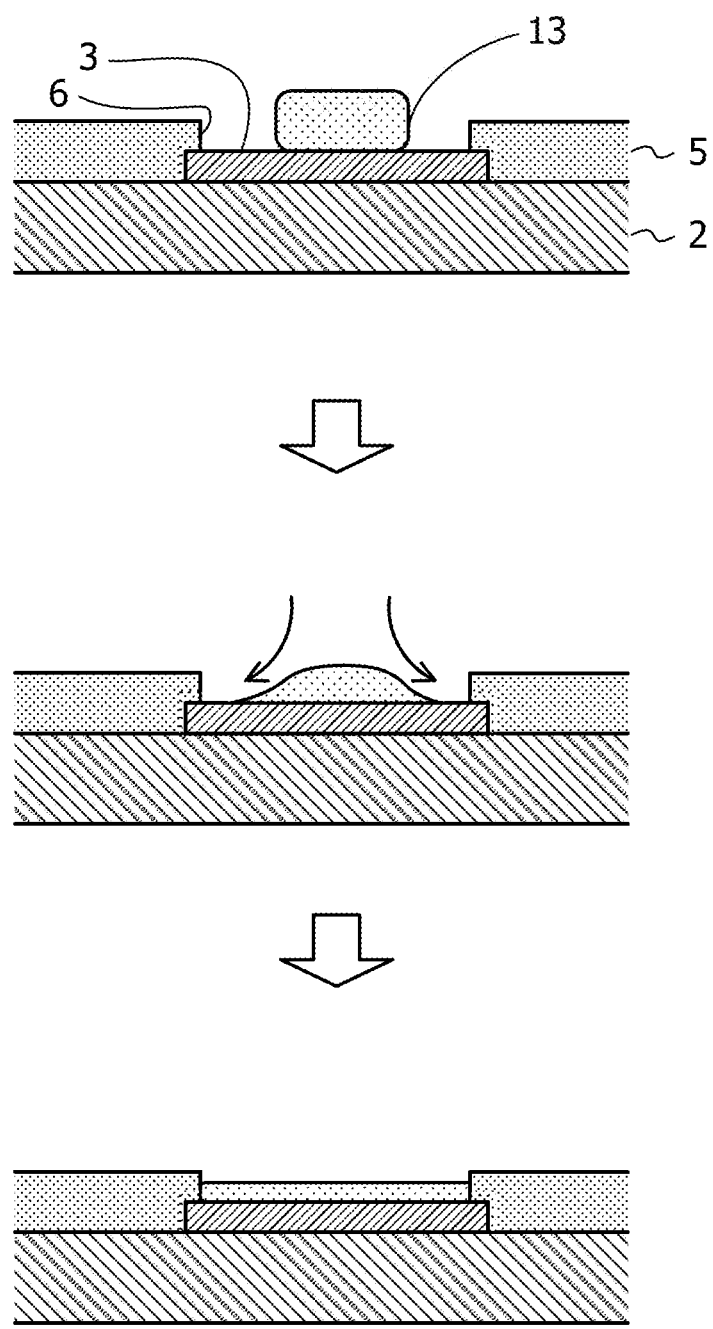
FIG. 17 is a sequence of views illustrating the manner in which flux is melted in a comparative example.

Hereinafter, the movement of the solder ball 4 when each opening 6 has no notch 7 (hereinafter referred to as the "comparative example") will be described. FIG. 17 is a sequence of views illustrating the manner in which the flux 13 is melted in the comparative example. When each opening 6 has no notch 7, even when the flux 13 transferred in a solid state to the surface of the land 3 is melted, there is no falling destination to which the flux 13 flows down from the surface of the land 3. Thus, the melted flux 13 spreads radially over the surface of the land 3. Therefore, in the comparative example, melting of the flux 13 causes an indefinite direction of movement of the solder ball 4 placed on the land 3 with the flux 13 interposed between the solder ball 4 and the land 3. For this reason, for instance, solder balls 4 may be moved as follows.

Figure 18:
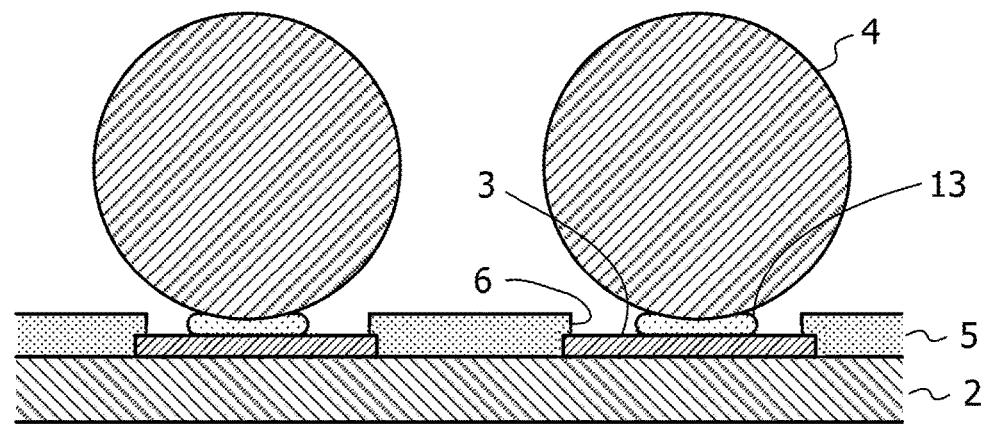
FIG. 18 is a sequence of side views illustrating the movement of solder balls before and after flux is melted in the comparative example.
Figure 18:
Figure 18:
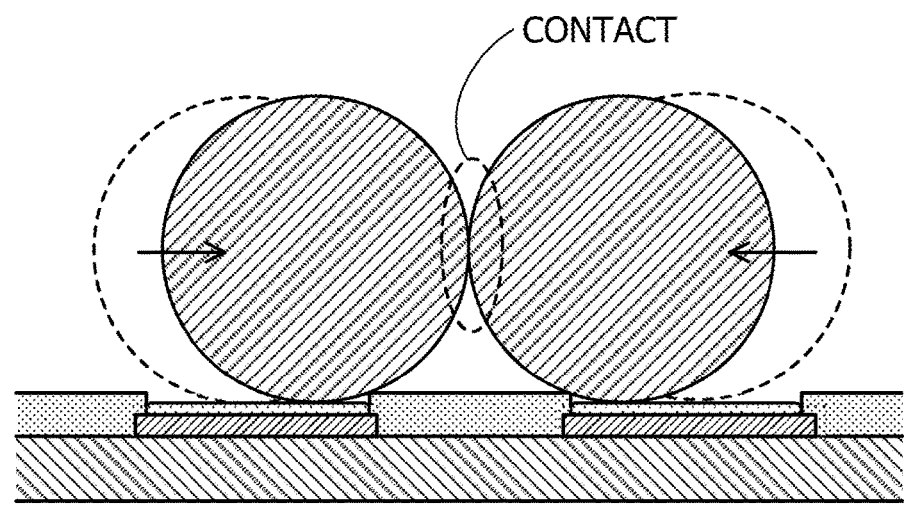
Figure 19:
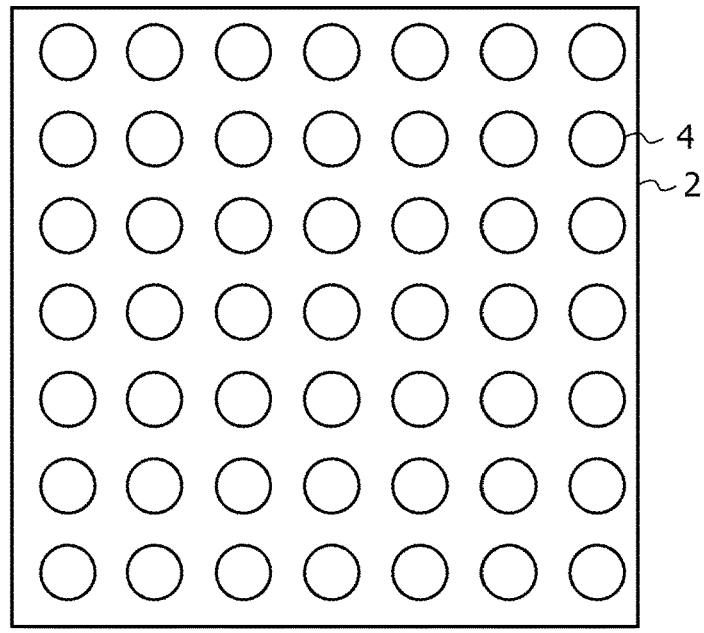
FIG. 19 is a sequence of overall plan views illustrating the movement of solder balls before and after flux is melted, as seen from the side on which solder balls are arranged in the comparative example.
Figure 19:
Figure 19:
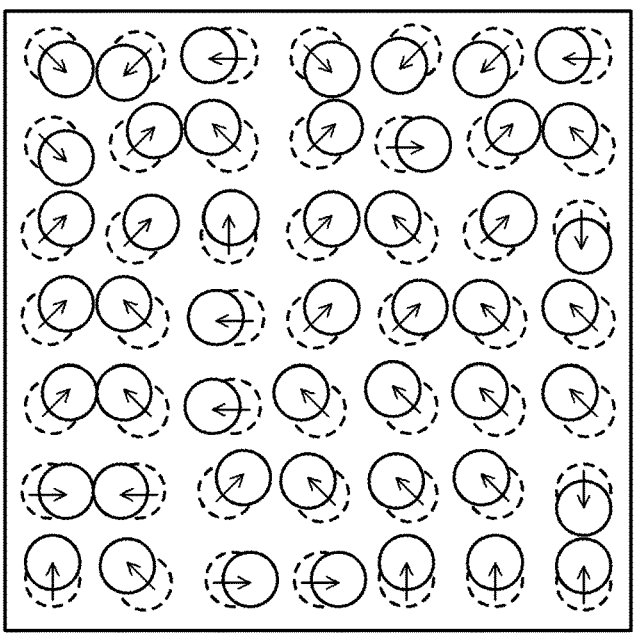

FIG. 18 is a sequence of side views illustrating the movement of solder balls 4 before and after the flux 13 is melted in the comparative example. In addition, FIG. 19 is a sequence of overall plan views illustrating the movement of the solder balls 4 before and after the flux 13 is melted, as seen from the side on which the solder balls 4 are arranged in the comparative example. In short, in the comparative example in which each opening 6 has no notch 7, when the flux 13 is melted, the solder balls 4 are moved in various directions. Thus, for instance, as illustrated in FIG. 18, a solder ball 4 may be moved in a direction in which the solder ball 4 and an adjacent solder ball 4 become closer. Consequently, a short circuit between the solder balls 4 occurs in a portion.

When the pitch between the solder balls is reduced in association with miniaturization of the BGA package, a short circuit due to movement of the solder balls in association with the flow of the flux is likely to occur. In this respect, in the embodiment, movement of the solder balls 4 due to the flux 13 when the solder balls 4 are fused to the respective lands 3 is made at least in a uniform direction, and thus the possibility of a short circuit between the solder balls 4 may be reduced, as compared with when the solder balls 4 are moved in different directions. Consequently, the improvement in the reliability of the BGA package substrate 1 is achieved.

The direction of movement of the solder balls 4 may be made in a uniform direction not only in the configuration in which one notch 7 is formed in each opening 6, but also in the configuration in which two or more notches 7 are provided in each opening 6. FIGS. 20A1 to 20C2 are second views illustrating variations in the forms of the notches 7. As described above, for instance, when in one of regions divided every 90 degrees around the center of the land 3, the combined area of the land 3 and the bottom 8 of the notch 7 is greater than the area of other three regions, the direction of movement of the solder balls 4 is controllable. This is because the flux 13 at the time of fusing of the solder ball 4 to the land 3 is likely to flow to a notch 7 having a relatively large area of the bottom 8. For instance, as illustrated in FIGS. 20A1 and 20A2, an elliptical-shaped notch 7 is provided in each of four directions from the center of the land 3, when in a region A between four regions A to D divided every 90 degrees indicated by a dashed line around the center of the land 3, the combined area of the land 3 and the bottom 8 of the notch 7 is greater than the area of other three regions B to D, the flux 13 at the time of fusing of the solder ball 4 to the land 3 is likely to flow to the notch 7 in the region A. Therefore, the solder ball 4 is moved to the region A. Such characteristics of the direction of movement of the solder balls 4 are the same with not only the case of elliptical-shaped notch 7, but also the case of square-shaped notch 7 as illustrated in FIGS. 20B1 and 20B2 and the case of circular-shaped notch 7 as illustrated in FIGS. 20C1 and 20C2, for instance.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A BGA package substrate comprising:
   a substrate;
   a plurality of lands each having a round shape formed over the substrate;
   a plurality of solder balls fused to the plurality of lands; and
   a resist formed over the substrate and includes a plurality of openings configured to expose the plurality of solder balls,
   each of the plurality of openings includes a notch that exposes a surface of the substrate adjacent with a first tip portion of a land of the plurality of lands, and
   a second tip portion of the land which is opposite side of the first tip portion is covered by the resist,
   the notch provided in each of the plurality of openings extends to a direction parallel to one of diagonals of the substrate to control movement of the plurality of solder balls.

2. The BGA package substrate according to claim 1, wherein the notch of any adjacent opening are disposed in a same positional relationship.

3. The BGA package substrate according to claim 1, wherein the resist includes a group of openings which are disposed in proximity to each other, and other openings at a position spaced apart from the group of openings, and at least each of the plurality of notches of the group of openings and the notch of any adjacent opening are disposed in a same positional relationship.

4. The BGA package substrate according to claim 1, wherein
   the substrate includes four vertexes, and
   the notch provided in each of the plurality of openings extends in a same direction to one vertex side of the four vertexes.

5. The BGA package substrate according to claim 1, wherein
   the plurality of openings belong to any one of four regions obtained by dividing the substrate, and
   the notch provided in each of the plurality of openings extends in a direction of a vertex of the substrate included in a region to which the notch belongs among the four regions.

6. A method of manufacturing a BGA package substrate, the method comprising:
   forming a plurality of lands each having a round shape formed over a substrate;
   forming a resist layer over the substrate;
   forming a plurality of openings at the resist such that each of the plurality of openings includes a notch that exposes a surface of the substrate adjacent with a first tip portion of a land of the plurality of lands;
   fusing a plurality of solder balls to the plurality of lands exposed through the plurality of openings,
   a second tip portion of the land which is opposite side of the first tip portion is covered by the resist, and
   the notch provided in each of the plurality of openings extends to a direction parallel to one of diagonals of the substrate to control movement of the plurality of solder balls.

7. The method according to claim 6, wherein the plurality of solder balls are respectively moved to the corresponding notch through following a flow of flux which flows down from a surface of the land to a bottom of the corresponding notch during the fusing.

* * * * *